(12) United States Patent
Guo et al.

(10) Patent No.: US 11,316,102 B2
(45) Date of Patent: Apr. 26, 2022

(54) COMPOSITE MULTI-STACK SEED LAYER TO IMPROVE PMA FOR PERPENDICULAR MAGNETIC PINNING

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 239 days.

(21) Appl. No.: 16/865,810

(22) Filed: May 4, 2020

(65) Prior Publication Data

US 2021/0343934 A1 Nov. 4, 2021

(51) Int. Cl.
| | | |
|---|---|---|
| *H01L 43/10* | (2006.01) | |
| *H01L 43/08* | (2006.01) | |
| *H01F 10/12* | (2006.01) | |
| *H01F 10/32* | (2006.01) | |
| *H01F 10/30* | (2006.01) | |

(52) U.S. Cl.
CPC ............ *H01L 43/10* (2013.01); *H01F 10/123* (2013.01); *H01F 10/30* (2013.01); *H01F 10/329* (2013.01); *H01F 10/3286* (2013.01); *H01L 43/08* (2013.01)

(58) Field of Classification Search
CPC ....... H01L 43/10; H01L 43/08; H01F 10/123; H01F 10/30; H01F 10/3286; H01F 10/329

USPC .................................................. 257/421, 295
See application file for complete search history.

(56) References Cited

U.S. PATENT DOCUMENTS

| | | | |
|---|---|---|---|
| 11,183,227 B1* | 11/2021 | Wang ...................... H01L 43/10 |
| 2014/0070341 A1* | 3/2014 | Beach ................. H01F 10/3272 257/E29.323 |
| 2014/0306302 A1* | 10/2014 | Jan ......................... H01L 43/12 257/421 |
| 2016/0315118 A1* | 10/2016 | Kardasz ................. H01L 43/10 |
| 2017/0077391 A1* | 3/2017 | Zhou ...................... B82Y 25/00 |
| 2021/0273157 A1* | 9/2021 | Guo ........................ H01L 43/08 |
| 2021/0343934 A1* | 11/2021 | Guo ....................... H01F 10/329 |

* cited by examiner

*Primary Examiner* — Jami Valentine Miller

(57) ABSTRACT

The invention comprises a novel composite multi-stack seed layer (CMSL) having lattice constant matched crystalline structure with the Co layer in above perpendicular magnetic pinning layer (pMPL) so that an excellent epitaxial growth of magnetic super lattice pinning layer $[Co/(Pt, Pd\ or\ Ni)]_n$ along its FCC (111) orientation can be achieved, resulting in a significant enhancement of perpendicular magnetic anisotropy (PMA) for perpendicular spin-transfer-torque magnetic-random-access memory (pSTT-MRAM) using perpendicular magnetoresistive elements as basic memory cells which potentially replace the conventional semiconductor memory used in electronic chips, especially mobile chips for power saving and non-volatility.

20 Claims, 2 Drawing Sheets

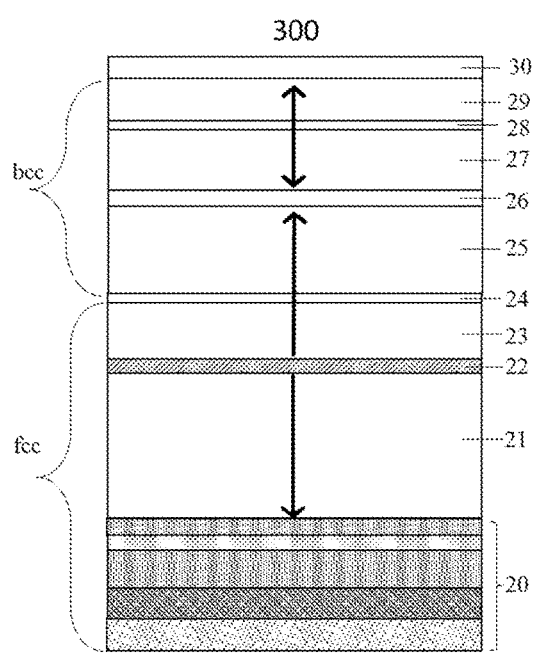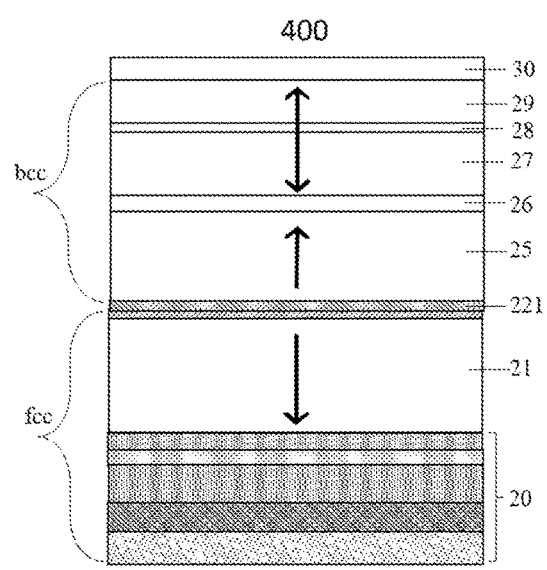
Fig.4
Fig.5

COMPOSITE MULTI-STACK SEED LAYER TO IMPROVE PMA FOR PERPENDICULAR MAGNETIC PINNING

BACKGROUND OF THE INVENTION

1. Field of the Invention

This invention relates to a novel composite multi-stack seed layer (CMSL) to improve perpendicular magnetic anisotropy (PMA) for magnetic pinning multilayer in a magnetic structure, such as a perpendicular magnetic tunnel junction.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a storage layer (SL) having a changeable magnetization direction, an insulating spacing layer, and a fixed pinning layer (PL) that is located on the opposite side from the SL and maintains a predetermined magnetization direction. The insulating spacing layer sandwiched between the SL and the PL serves as a tunneling barrier (TB) in a magnetic tunnel junction. In a SOT MRAM, there is an additional SOT layer immediately located on a surface of the SL, which is opposite to a surface of the SL where the insulating spacing layer is provided. SOT can be a thin layer made of heavy transition metal layer such as W or Ta, Pt, etc., or a layer of topological insulating layer such as BiSB.

As a write method to be used in such magnetoresistive elements of a STT MRAM, there has been suggested a write method (spin torque transfer switching technique) using spin momentum transfers. According to this method, the magnetization direction of a storage layer (SL) is reversed by applying a spin-polarized current to the magnetoresistive element. Furthermore, as the volume of the magnetic layer forming the SL is smaller, the injected spin-polarized current to write or switch can be also smaller. Accordingly, this method is expected to be a write method that can achieve both device miniaturization and lower currents. In a SOT MRAM, an electric current flows in the SOT layer, which is also a paramagnetic layer, to generate a spin-polarized current and inject it into its adjacent recording layer, which is a ferromagnetic layer. The spin-polarized current then exerts a torque on the magnetic moment to reverse it.

Further, as in a so-called perpendicular pMTJ element, both two magnetization films, i.e., the storage layer (SL) and the pinning layer (PL), have easy axis of magnetization in a direction perpendicular to the film plane due to their strong perpendicular interfacial anisotropy and magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a BCC or HCP-phase cap layer that sandwich a thin storage layer (SL) having an amorphous CoFeB ferromagnetic film and accelerate crystallization of the amorphous ferromagnetic film to match interfacial grain structure to MgO layer through a thermal annealing process. The SL crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunnel junction structure is formed. By using this technique, a high MR ratio can be achieved.

A core structure of the pMTJ stack 100 comprises (see FIG. 1) a fixed perpendicular magnetic pinning element (pMPE) 70, a tunnel barrier, and a variable storage layer (SL) 90. The pMPE is typically formed by a relatively thick perpendicular synthetic antiferromagnetic (pSAF) stack of composition: seed-layer/$[Co/X]_m$/Co/Ru/Co/$[X/Co]_n$/crystal-structure transition layer (5)/FeCoB reference layer (6)/tunnel barrier (7), where X represents Pt, Pd or Ni metals, m and n are integers (normally m>n), and Ru is a spacer to provide perpendicular RKKY coupling between $[Co/X]_m$/Co and Co/$[X/Co]_n$. Here and thereafter throughout this application, each element written in the left side of "/" is stacked below an element written in the right side thereof. A typical film stack of bottom-pinned pMTJ (100) is shown in FIG. 1 which starts from a seed layer (1) such as Pt, a perpendicular synthetic antiferromagnetic (pSAF) multilayer stack containing a perpendicular magnetic pinning layer (pMPL) (2) $[Co/Pt]_m$/Co, a Ru spacer (3), an upper magnetic multilayer (4) such as Co/$[Pt/Co]_n$, a crystal structure transition layer (5) such as W, Mo or Ta, a magnetic reference layer (6) such as amorphous CoFeB, a TB MgO (7), a tri-layer SL formed with a first storage layer (8) such as CoFeB, a non-magnetic B absorption layer (9) such as W, Mo or Ta and a second storage layer (10) such as CoFeB, a capping layer (11), such as MgO, W or W/Ru. This pMTJ comprises a thick pMPE film stack although it has a strong pSAF.

Recently a French research group proposed (see *Scientific Reports* 8, Article number: 11724, 2018) another pMTJ stack 200 with a thin synthetic antiferromagnetic (tSAF) structure (see FIG. 2) comprising a Pt seed-layer (1) on which a perpendicular pinning layer $[Co/Pt]_m$/Co (2), bi-layer Ru/W spacer (31) and magnetic reference layer CoFeB (6) with the rest (layer 7 through 11 similar to those in FIG. 1). Although the authors claimed multi-functionalities of their bi-layer Ru/W spacer 31): (i) absorbing boron out of the magnetic layer (FeCoB) in contact with W layer upon annealing, (ii) allowing the crystalline transition between the FCC part of the stack $[Co/Pt]_m$/Co of 3-fold symmetry and the BCC part of the stack FeCoB next to the MgO barrier (of 4-fold symmetry) and (iii) preventing inter-diffusion between the two parts of the SAF during high temperature annealing. RKKY coupling at W/CoFeB interface is not as strong as at the Co/Ru interface, such tSAF exhibits a serious magnetic instability during information writing.

No matter whether it is a thick pSAF or thin tSAF film stack, a key factor to achieve stable magnetic pinning is perpendicular magnetic anisotropy (PMA) of the perpendicular magnetic pinning layer (pMPL) $[Co/Pt]_m$/Co (12), which provides a magnetic anchoring force to prevent the entire pSAF (or tSAF) film stack from a concurrent rotation under the influence of spin transfer torque or an external magnetic field. It was reported (see Article: *Appl. Phys. Lett.* 96, 152505 (2010)) that the PMA of Co/Pt (or Co/Pd) magnetic multilayer is closely dependent on the lattice constant of the multilayer itself, and a positive (perpendicular) PMA occurs only when Co/Pt (or Co/Pd) multilayer has FCC crystalline structure with a lattice constant larger than ~0.372 nm, and the larger the lattice constant, the higher is the PMA of Co/Pt (or Co/Pd) multilayer. Without an external factor, increase of the PMA of Co/Pt (or Co/Pd) can only be achieved by increasing the thickness of Pt (or Pd) spacer. However, a research group found (see their report: *Sensors*, 17(12): 2743, December 2017) that the effective energy per bilayer starts to decrease linearly after a lattice constant value of ~0.383 nm. They attributed this to the enhanced increase in the Pd fraction compared to the Co, which weakens the ferromagnetic coupling between the adjacent ultrathin Co layers. It has been found that the seed-layer underneath the SAF stack plays an important role. For example, the French research group found that the PMA of the perpendicular magnetic pinning layer (pMPL) increases as its Pt seed-layer thickness increases from 5 nm to 30 nm (see FIG. 4, *Scientific Reports* 8, Article number: 11724, 2018), i.e., a thicker seed-layer improves the crystalline quality and the face-center-cubic (FCC) (111) texture of the [Co/Pt]$_m$ multilayer. However, the surface roughness of Pt seed-layer increases with its thickness, which would negatively affect the magneto-resistance of the MTJ as well as other magnetic performance, and more seriously, a thicker Pt seed-layer in the stack below the tunnel barrier is very disadvantageous for the large amount of re-deposited electrical-shorting species on the sidewalls of the MTJ during later reactive ion etching (RIE) or ion beam etching (IBE) process and also for its high cost of the noble metal material.

SUMMARY OF THE PRESENT INVENTION

The present invention discloses a composite multi-stack seed layer (CMSL) having face-center-cubic (FCC) crystalline structure with a large grain size and a flat or smooth surface to promote a perfect FCC (111) growth with a large grain size and a flat or smooth surface for above perpendicular magnetic pinning layer (pMPL) to enhance its PMA needed for magnetic stabilization in a large temperature range. Said CMSL comprises a base layer (BL), a FCC structure initialization and smoothening (SIS) layer having a face-center-cubic (FCC) crystalline structure, a FCC grain-growth promotion (GGP) layer having a face-center-cubic (FCC) crystalline structure, a structure buffer (SB) layer, and a PMA seed layer (PSL) having a face-center-cubic (FCC) crystalline structure, which are stacked in a form of BL/SIS/GGP/SB/PSL or BL/SIS/GGP/PSL which does not include the SB layer or the thickness of the SB layer is equal to zero, wherein said BL is made of transition metal material, such as Ta, Hf, Ti, Zr, Nb, W, Cr, or their nitride, the SIS is made of a metal layer containing at least one from the group of NiFe, NiCo, NiFeCo, NiCr, NiTa, NiZr, NiRh, NiFeCr, NiFeTa, NiFeZr, NiFeRh, Ru, NiMn, IrMn and FeMn, the GGP layer is made of Cu, CuN or CuNi, the SB layer is made of Ta, W, Ru or Ir, and the PSL layer is made of a thin noble metal layer containing at least one element from the group of Pt, Pd, Ni and Ir and having a thickness less than 3 nm.

Said CMSL and pMPL both having an FCC crystalline structure together with a composite non-magnetic spacer (CnmS) and a perpendicular magnetic reference layer (pMRL) having a body-center-cubic (BCC) crystalline structure constitute a strong perpendicular magnetic pinning element (pMPE): CMSL/pMPL/CnmS/pMRL with enhanced synthetic antiferromagnetic (eSAF) coupling.

Said pMPL comprises a multilayer stack containing one selected from the group of [Co/(Pt, Pd or Ni)]$_n$/Co, [Co/(Pt, Pd or Ni)]$_n$/Co/CoFe and [Co/(Pt, Pd or Ni)]$_n$/CoFe, and said CnmS comprises either a single layer of Ru, Rh or Ir or a bi-layer of (Ru, Rh or Ir)/Cr or tri-layer of (Ru, Rh or Ir)/(W, Mo or V)/Cr, and said pMRL comprises a single layer CoFeB, or a multilayer stack either of Co/[(Pt, Pd or Ni)]$_m$/Co/(W, Mo or Ta)/CoFeB for single layer Ru spacer, or Fe/CoFeB, Fe/FeB, FeB/CoFe for bilayer or tri-layer CnmS.

Said pMPE with large PMA are employed to form a perpendicular magnetoresistive element (pMRE) comprising CMSL/pMPL/CnmS/pMRL/TB/SL/CL, wherein said TB is a tunnel barrier, SL is a storage layer (SL) having magnetic anisotropy in a direction perpendicular to a film surface and having a variable magnetization direction on the tunnel barrier layer and CL is a capping layer.

Said pMRE is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

BRIEF DESCRIPTION OF THE DRAWINGS

FIG. 4 A bottom-pinned pSTT-MRAM with a thick pSAF film stack having a CMSL.

FIG. 5 A bottom-pinned pSTT-MRAM with a thin tSAF film stack having a CMSL.

DETAILED DESCRIPTION OF THE INVENTION

The perpendicular magnetic anisotropy (PMA) of said pMPL [Co/Pt, Pd or Ni)]$_n$ multilayer is closely related to its lattice structure. In this invention, we employ a composite multi-stack seed layer (CMSL) having a FCC crystalline structure with (111) orientation plane normal to a film surface, i.e., FCC (111) texture, at the bottom of pMPL multilayer to provide a specially engineered lattice mold (bedding) for the growth of closed packed Co layer in the [Co/(Pt, Pd or Ni)]$_n$ multilayer to maximize its PMA. Among the various materials in periodical table, there are some metallic elements which naturally form an FCC crystalline structure in their solid phase with lattice constant close to the closed packed (either FCC or HCP) Co, which is the key element that form [Co/(Pt, Pd or Ni)]$_n$ multilayer, which sometimes is referred as a superlattice due to its periodic structure in atomic level. The Co layer in said pMPL is directly deposited over the top layer (Pt, Pd, Ni or Ir) of said CMSL stack, which has a perfect FCC (111) orientation normal to the film surface.

Figure 1:
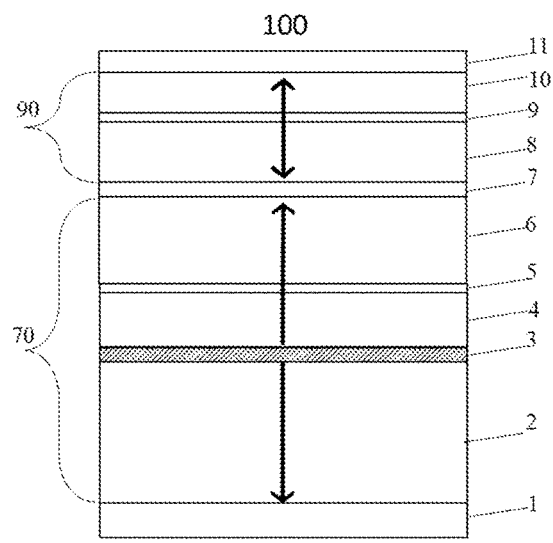
FIG. 1 A conventional pSTT-MRAM film stack with a perpendicular synthetic antiferromagnetic (pSAF) pinning layer.
Figure 2:
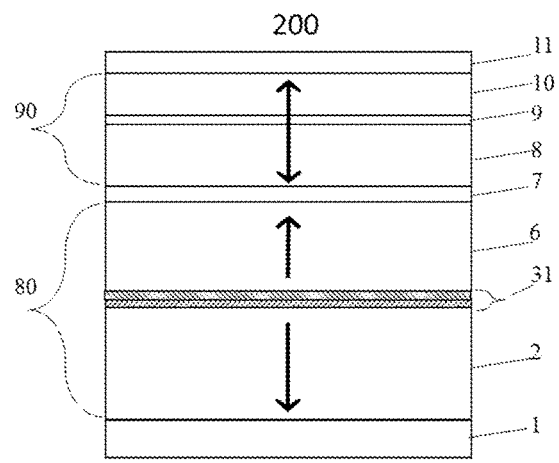
FIG. 2 A pSTT-MRAM film stack with a thin synthetic antiferromagnetic (tSAF) pinning layer.
Figure 3:
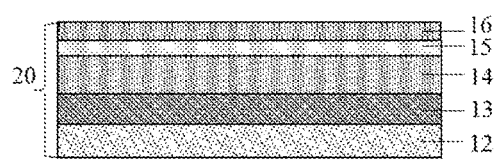
FIG. 3 A building stack of a composite multi-stack seed layer (CMSL).

Said CMSL comprises (see FIG. 3) a base layer (BL) 12 made of a metal layer or metal nitride layer comprising at least one element selected from the group consisting of transition metal material, such as Ta, Hf, Ti, Zr, Nb, W, Cr, with a thickness between 2-10 nm, a FCC structure initiation and smoothening layer (SIS) 13 made of a metal layer comprising at least one selected from the group of NiFe, NiCo, NiFeCo, NiCr, NiTa, NiZr, NiRh, NiFeCr, NiFeTa, NiFeZr, NiFeRh, Ru, NiMn, IrMn and FeMn with a thickness between 1-10 nm, a FCC grain-growth promotion layer (GGP) 14 having a face-center-cubic (FCC) crystalline structure made of Cu, CuN or CuNi with a thickness between 7-30 nm, a structure buffer (SB) layer 15 made of Ta, W, Ru or Ir with a thickness between 0-1.5 nm, and a thin (Pt, Pd, Ni or Ir) PMA seed layer (PSL) 16 with a thickness between 1-3 nm, and said CMSL is stacked in a form of BL/SIS/GGP/SB/PSL (see FIG. 3) or BL/SIS/GGP/PSL by skipping the SB layer 15 (not shown). Normally, the average grain size in thin films tends to increase with increasing film thickness. A flat and smooth surface with a large crystalline grain will be established after the growth of BL/SIS/GGP which gives rise to a strong FCC (111) texture as well as large grain size of PSL layer and helps the PSL to form a perfect lattice matched FCC bedding for the growth of pMPL even if a very thin (0.5-1 nm) PSL is used, which is particularly good for a cost-effective mass production of pSTT-MRAM device since Pt, Pd or Ir are very expensive materials. The SIS layer can be either a single layer or multilayer. The SB layer is less than one atomic layer thick and serves to better protect the top surface FCC crystalline structure of the Cu containing GGP layer from the deposition bombardment of heavy metal atoms during the deposition processing of the PSL layer, and is optional, i.e., SB layer is not needed if the bombardment energy during the PSL layer deposition is adjusted to be small enough. For an example, the CMSL structure having a single SIS layer can be Ta(4 nm)/Ni$_{0.55}$Cr$_{0.44}$ (5 nm)/Cu(10 nm)/Ru(0.5 nm)/Pt (1.5 nm). And one example of the CMSL having a multi-layer-structured SIS can be Ta(4 nm)/(Ni$_{0.5}$Fe$_{0.5}$)$_{0.55}$Cr$_{0.44}$ (5 nm)/(Ni$_{0.81}$Fe$_{0.19}$)$_{0.55}$Cr$_{0.44}$ (5 nm)/Cu(5 nm)/Ta(0.5 nm)/Pt (1.5 nm).

The following lists are some typical embodiments to illustrate the use of said CMSL to improve PMA for perpendicular magnetic stabilization for bottom-pined pSTT-MRAM having either a thick pSAF or thin tSAF film stack:

First Embodiment

FIG. 4 is bottom-pinned pSTT-MRAM (300) having a thick pASF film stack. A composite multi-stack seed layer (CMSL) (20) was first grown on a device substrate, followed by a thick pSAF stack (21/22/23) of [Co/Pt or Pd]$_n$Co/(Ru or Ir)/Co/[(Pt or Pd)/Co]$_m$ with thickness values of (0.3-0.7) for Co and 0.2-0.8 for Pt (or Pd) and repetition number (n>m) between 2-6 for n and 1 to 4 for m, followed by a crystalline structure transition layer (24) of Ta, W, or Mo with thickness between 0.1-0.5 nm, and magnetic reference layer (25) of CoFeB with thickness between 0.9-1.3 nm, a tunnel barrier (26) of MgO between 0.8-1.2 nm, a composite storage layer of first magnetic CoFeB (27) with thickness between 1.0-1.5 nm, B absorption layer (28) of Ta, W, Mo) with thickness between 0.15-0.5 nm, second magnetic CoFeB (29) with thickness between 0.5-1.0 nm and a capping stack (30) of MgO/W/Ru with thickness of (1.0-1.5 nm)/1-3 nm)/(2-5 nm) respectively. The annealing temperature of above film stack is between 350 C-450 C for 30 min to 150 min. With the help of said CMSL, after annealing the bottom portion of the film stack including layers 20-23 will be converted into FCC crystalline structure with (111) orientation normal to substrate surface and upper portion of the film stack including layer 25-29 into a BCC (100) crystalline structure to achieve a large PMA while maintaining high tunnel magnetoresistive (TMR) value. During annealing the layer (24) of Ta, W or Mo helps crystalline transition between bottom FCC to top BCC structure (see FIG. 4).

Second Embodiment

FIG. 5 is a bottom-pinned pSTT-MRAM having a thin film stack (400) with an enhanced synthetic antiferromagnetic (eSAF) coupling. A composite multi-stack seed layer (CMSL) (20) was first grown on a device substrate, followed by a magnetic superlattice (21) selected from the group of [Co/X]$_n$/Co, [Co/X]$_n$/Co/CoFe and [Co/X]$_n$/CoFe on is an integer between 2-6 with thickness of Co (0.25-0.6 nm)/X (0.2-0.4 nm) on top of said CMSL (20) where X is selected among Pt, Pd or Ni, a composite non-magnetic spacer (CnmS-221) [(Ru, Rh or Ir)/Cr or (Ru, Rh or Ir)/(W, Mo or V)/Cr]/Fe, an amorphous FeB or CoFeB reference layer (25) in contact with Fe from below, a tunnel barrier MgO (26), a tri-layer recording layer formed with a first magnetic layer (27), a non-magnetic bridging layer (28) and a second magnetic layer (29), a capping layer (30), such as MgO, W or W/Ru. In the above stack, the thickness of Ru, Ru or Ir is between 0.3 to 0.7 nm and Cr or (W or Mo)/Cr thickness is between 0.1 to 0.5 nm, with a combined CnmS [(Ru, Rh or Ir)/Cr or (Ru, Rh or Ir)/(W, Mo or V)/Cr] thickness chosen to reach the first or the second peak for an effective RKKY coupling, the amorphous FeB or CoFeB reference layer (25) has a B composition between 15-35% with a thickness between 0.8 to 1.4 nm, the thickness of MgO TB (26) is between 0.8-1.2 nm, the thickness of the first magnetic memory layer (27) can be selected among CoFeB, FeB, Fe/CoFeB with a B composition between 15-30% and preferably at 20% and a thickness between 1-1.6 nm, the non-magnetic bridging layer (28) is selected among W, Mo, Ta with a thickness between 0.1-0.6 nm, the second magnetic memory layer (29) is selected from CoFeB, FeB with a B composition between 15-30% with a thickness between 0.4-0.8 nm, the capping layer (30) can be either (1-1.5 nm) MgO/(2-5 nm) W, (2-5 nm) W/(2-4 nm) Ru or MgO/W/Ru. The use of Fe at the Cr interface, not only increases the RKKY coupling hence improving magnetic stability for the device, but also creates a good BCC structure right starting from the CoFeB reference layer, throughout the barrier MgO layer to the entire memory tri-layer layer owing to the intrinsic BCC structure of Fe. Such a bottom-pinned pSTT-MRAM film stack will have strong magnetic pinning with sharp layer interfaces and higher and stable TMR characteristics, which is good for pSTT-MRAM device application. The annealing temperature of above bottom-pinned film pSTT-MRAM stacks are between 350 C-450 C for between 30 min to 150 min. With the help of said CMSL (20), after annealing the low portion (20-21) of the stack will be converted into FCC crystalline structure with (111) orientation normal to film surface and upper portion of the stack (25-29) above Cr into a BCC (100) crystalline structure to achieve a large PMA while having a high tunnel magnetoresistive (TMR) value.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A perpendicular magnetic pinning element (pMPE) comprising
    a composite multi-stack seed layer (CMSL) provided on the surface of a substrate and comprising: a base layer (BL), a FCC structure initiation and smoothening (SIS) layer disposed over the BL layer, a FCC grain-growth promotion (GGP) layer having a face-center-cubic (FCC) crystalline structure and disposed over the SIS layer, a structure buffer (SB) layer disposed over the GGP layer, and a PMA seed layer (PSL) disposed over the SB layer;
    a perpendicular magnetic pinning layer (pMPL) provided on the surface of the CMSL and having a face-center-cubic (FCC) crystalline structure and having a perpendicular magnetic anisotropy (PMA) and having an invariable magnetization direction;
    an antiferromagnetic coupling spacer (AFCS) provided on the surface of the pMPL;
    a perpendicular magnetic reference layer (pMRL) provided on the surface of the AFCS and having a perpendicular magnetic anisotropy and having an invariable magnetization direction;
    wherein said pMPE forming a strong perpendicular antiferromagnetic coupling (pAFC) between the pMPL and the pMRL through said AFCS.

2. The element of claim 1, wherein said BL is made of a metal layer or a metal nitride layer comprising at least one transition metal element selected from the group consisting of Ta, Hf, Ti, Zr, Nb, W, Cr, and having a thickness between 2-10 nm.

3. The element of claim 1, wherein said SIS layer is made of a metal layer comprising at least one selected from the group of NiFe, NiCo, NiFeCo, NiCr, NiTa, NiZr, NiRh, NiFeCr, NiFeTa, NiFeZr, NiFeRh, Ru, NiMn, IrMn and FeMn, and having a thickness between 1-10 nm.

4. The element of claim 1, wherein said SIS layer is a multilayer comprising at least two sub-layers selected from the group of NiFe, NiCo, NiFeCo, NiCr, NiTa, NiZr, NiRh, NiFeCr, NiFeTa, NiFeZr, NiFeRh, Ru, NiMn, IrMn and FeMn, and having a thickness between 1-10 nm.

5. The element of claim 1, wherein said GGP layer is made of Cu, CuN or CuNi and having a thickness between 3-30 nm.

6. The element of claim 1, wherein said SB layer is made of Ta, W, Ru or Ir and having a thickness between 0-1.5 nm.

7. The element of claim 1, wherein said PSL layer is made of Pt, Pd, Ni or Ir and having a thickness between 1-3 nm.

8. The element of claim 1, wherein said pMPL comprises a multilayer stack structure selected from the group of [Co/(Pt, Pd or Ni)]$_n$/Co, [Co/(Pt, Pd or Ni)]$_n$/Co/CoFe and [Co/(Pt, Pd or Ni)]$_n$/CoFe, wherein n is an integer between 2 and 6 inclusive, and thicknesses of each said Co sub-layer and (Pt, Pd or Ni) sub-layer are between 0.25 nm-0.7 nm and between 0.2 nm-0.8 nm, respectively.

9. The element of claim 1, wherein said pMRL comprises a single layer CoFeB or a multilayer stack structure [Co/(Pt, Pd or Ni)]$_m$/(Co or Ta/Co)/(W or Mo)/CoFeB or Fe/[Co/(Pt, Pd or Ni)]$_m$/(Co or Ta/Co)/(W or Mo)/CoFeB, wherein m is an integer between 2 and 4 inclusive; and said Co layer has a thickness between 0.25-0.7 nm, said (Pt, Pd or Ni) layer has a thickness between 0.2-0.8 nm, said CoFeB layer has a thickness between 0.7-1.5 nm, said (W or Mo) layer has a thickness between 0.1-0.5 nm, said Ta layer has a thickness between 0.05-0.2 nm.

10. The element of claim 1, wherein said pMRL comprises a bi-layer stack structure Fe/CoFeB, Fe/FeB, FeB/CoFeB, or Fe/CoFe, wherein said Fe layer has a thickness between 0.1-0.5 nm, said CoFeB, FeB and CoFe layer have thicknesses between 0.7 nm-1.3 nm.

11. The element of claim 1, wherein said pMRL is made of a single layer of CoFeB and having a thickness between 0.7 nm-1.3 nm.

12. The element of claim 1, wherein said AFCS is made of a single layer of (Ru, Rh or Ir) or a composite non-magnetic spacer (CnmS) with a bi-layer structure of (Ru, Rh or Ir)/(Cr, Mo, W or V) or tri-layer structure of (Ru, Rh or Ir)/(W, Mo or V)/Cr.

13. The element of claim 1, wherein said pMPE has its magnetization direction perpendicular to a film surface, and said pMPE further forms a perpendicular magnetic tunnel junction (pMTJ) further comprising a tunnel barrier (TB) and a storage layer (SL), wherein said TB is sandwiched between said SL and said pMRL.

14. The element of claim 13, wherein said TB is an MgO layer having a thickness between 0.8 nm to 1.5 nm, and said SL is a single layer CoFeB or tri-layer CoFeB/(W or Mo)/CoFeB having a total CoFeB thickness between 1nm-2.0nm, wherein said W or Mo layer has a thickness between 0.1nm-0.5 nm.

15. The element of claim 13, wherein said pMTJ comprises a film stack of CMSL/pMPL/AFCS/pMRL/TB/SL/capping layer counting from bottom to top, forming a bottom-pinned pSTT-MRAM film element.

16. The element of claim 15, wherein said bottom-pinned pSTT-MRAM film element comprises a film stack of substrate/CMSL/[Co/(Pt, Pd or Ni)]n/Co/(Ru, Rh or Ir)/[Co/(Pt, Pd or Ni)]~/Co/(Ta, W or Mo)/CoFeB/MgO/CoFeB/(W or Mo)/CoFeB/MgO/W/Ru/Ta, with said repetition numbers n and m ranging from 2 to 6 and 1 to 4, respectively.

17. The element of claim 15, wherein said bottom-pinned pSTT-MRAM film element comprises a film stack of substrate/CMSL/[Co/(Pt, Pd or Ni)]n/Co/(Ru, Rh or Ir)/Cr/Fe/CoFeB/MgO/CoFeB/W or Mo/CoFeB/MgO/W/Ru/Ta or substrate/CMSL/[Co/(Pt, Pd or Ni)]J/Co/(Ru, Rh or Ir)/(W, Mo or V)/Cr/Fe/CoFeB/MgO/CoFeB/W or Mo/CoFeB/MgO/W/Ru/Ta.

18. A method of forming a bottom-pinned pSTT-MRAM film stack comprising:
    forming a composite multi-stack seed layer (CMSL), on a substrate, having a five-layer stack in a form of a base layer (BL)/a FCC structure initiation and smoothening (SIS) layer/a FCC grain-growth promotion (GGP) layer/a structure buffer (SB) layer/a PMA seed layer (PSL), or a four-layer stack in a form of a base layer (BL)/a FCC structure initiation and smoothening (SIS) layer/a FCC grain-growth promotion (GGP) layer/a PMA seed layer (PSL);
    forming a perpendicular magnetic pinning layer (pMPL) on the surface of said CMSL and having a face-center-cubic (FCC) crystalline structure and having an invariable perpendicular magnetization direction;
    forming an antiferromagnetic coupling spacer (AFC) provided on the surface of the pMPL and having a single layer structure of (Ru, Rh or Ir), bi-layer structure of (Ru, Rh or Ir)/Cr or tri-layer structure of (Ru, Rh or Ir)/(W, Mo or V)/Cr;

forming a perpendicular magnetic reference layer (pMRL) provided on the surface of the AFC and having an invariable magnetization direction;

forming a tunnel barrier (TB) layer on the surface of said pMRL;

forming a magnetic storage layer (SL) on the surface of said TB;

forming a capping layer on the surface of said SL;

annealing said film stack substrate/CMSL/pMPL/AFMs/PMRL/TB/SL/capping layer at temperature between 350-450 C for 30-150 minutes.

19. The element of claim 18, wherein said BL is made of a metal layer or metal nitride comprising at least one transition metal element selected from the group consisting of Ta, Hf, Ti, Zr, Nb, W, Cr, and having a thickness between 2-10 nm; said SIS layer is made of a metal layer comprising at least one selected from the group of NiFe, NiCo, NiFeCo, NiCr, NiTa, NiZr, NiRh, NiFeCr, NiFeTa, NiFeZr, NiFeRh, Ru, NiMn, IrMn and FeMn and having a thickness between 1-10 nm; said GGP layer is made of Cu, CuN or CuNi and having a thickness between 3-30 nm; said SB layer is made of Ta, W, Ru or Ir and having a thickness between 0-1.5 nm; said PSL layer is made of Pt, Pd, Ni or Ir and having a thickness between 1-3 nm.

20. The method of claim 18 makes a pSTT-MRAM device having said bottom-pinned pSTT-MRAM film stack electrically connected between a top electrode and a bottom electrode and having write/read operations as a storage device.

* * * * *